United States Patent
Strobel et al.

[11] Patent Number: 5,825,042
[45] Date of Patent: Oct. 20, 1998

[54] RADIATION SHIELDING OF PLASTIC INTEGRATED CIRCUITS

[75] Inventors: David J. Strobel, Poway; David R. Czajkowski, La Jolla, both of Calif.

[73] Assignee: Space Electronics, Inc., San Diego, Calif.

[21] Appl. No.: 372,235

[22] Filed: Jan. 13, 1995

Related U.S. Application Data

[63] Continuation-in-part of Ser. No. 77,731, Jun. 18, 1993, abandoned.

[51] Int. Cl.$^6$ .................................................. G21F 1/08
[52] U.S. Cl. ........................................ 250/515.1; 437/938
[58] Field of Search ........................... 250/515.1; 437/938

[56] References Cited

U.S. PATENT DOCUMENTS

| | | | |
|---|---|---|---|
| 4,468,411 | 8/1984 | Sloan et al. | 427/8 |
| 4,833,334 | 5/1989 | Valy | 250/515.1 |
| 4,835,120 | 5/1989 | Mallik et al. | 437/209 |
| 4,888,449 | 12/1989 | Crane et al. | 174/52.4 |
| 4,891,687 | 1/1990 | Mallik et al. | 357/70 |

FOREIGN PATENT DOCUMENTS 0160327  11/1985  European Pat. Off. ............ 250/515.1

*Primary Examiner*—Jack I. Berman
*Attorney, Agent, or Firm*—Bernard L. Kleinke; Jerry R. Potts; Peter P. Scott

[57] ABSTRACT

A new and improved process by which plastic material forming the plastic body package of an integrated circuit is selectively removed and replaced with a radiation shield having a specific formulation that is customized for a given radiation environment dependent upon the space application in which the integrated circuit is to be used.

24 Claims, 4 Drawing Sheets

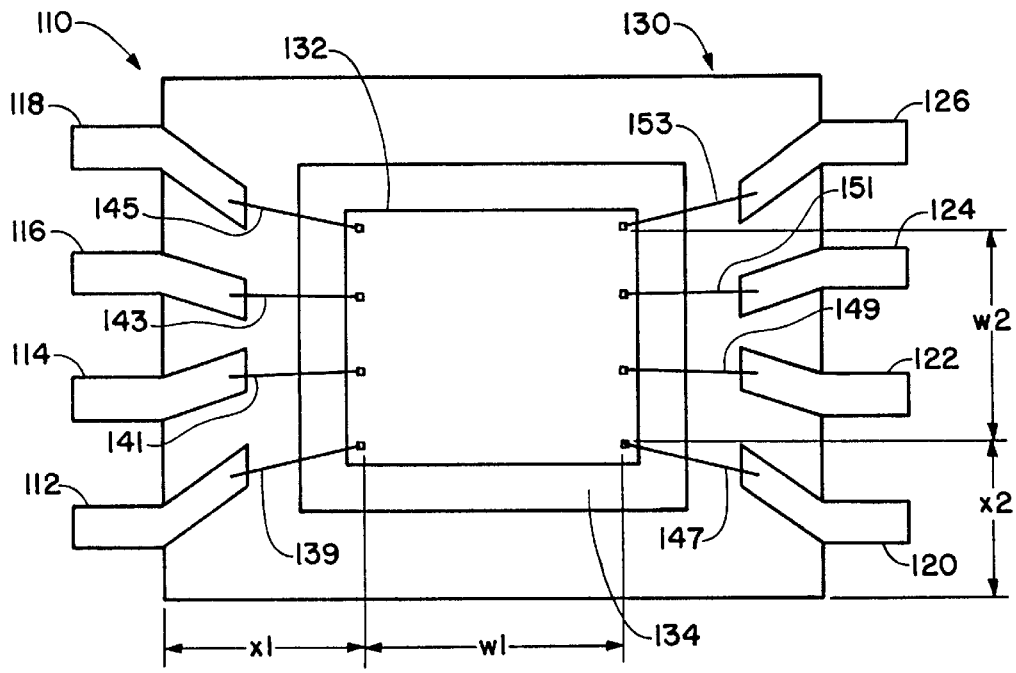
FIGURE 3B
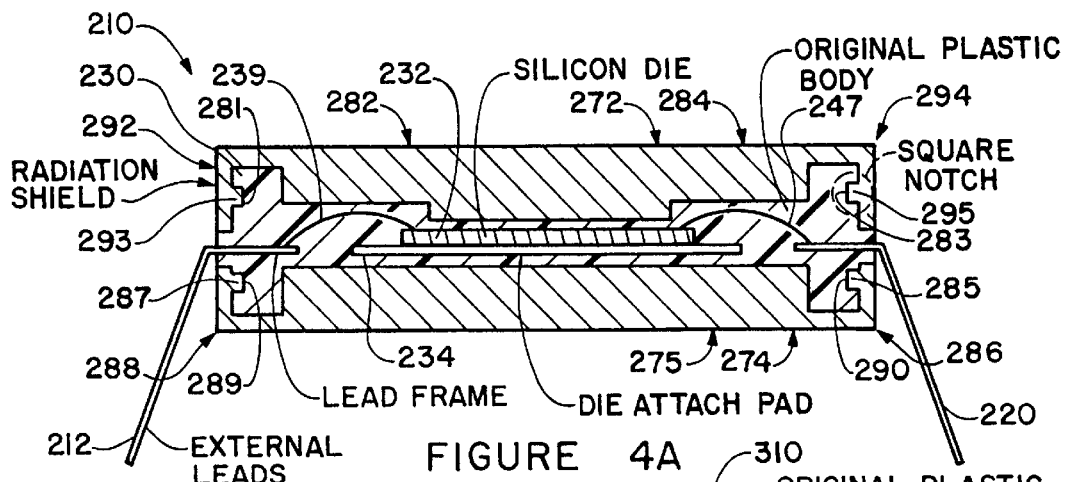
FIGURE 4A
FIGURE 4B

RADIATION SHIELDING OF PLASTIC INTEGRATED CIRCUITS

CROSS REFERENCE TO RELATED APPLICATIONS

This patent application is a continuation-in-part application of U.S. patent application Ser. No. 08/077,731 filed on Jun. 18, 1993, now abandoned, entitled "RADIATION SHIELDING OF PLASTIC INTEGRATED CIRCUITS," and is incorporated herein by reference as if fully set forth herein.

TECHNICAL FIELD

The present invention relates in general to improved packaging configurations and processes for improving the radiation tolerance of commercially available plastic packaged microelectronic devices. The inventive process relates more particularly to the formulation and affixation of customized radiation shields to commercially available plastic packaged integrated circuits.

BACKGROUND ART

Typical commercially available plastic integrated circuits have not been ordinarily used in spacecraft applications because of perceived and real reliability problems. The past practice has been to use only ceramic devices that have been either screened for radiation tolerance or designed to meet high radiation levels. Based on recent improvements in plastic package construction and reliability, the desire to use the latest in commercially available devices, and cost consideration, has resulted in the widespread use of plastic packaged devices. One major concern has been the reliability and the survivability of the devices being considered when exposed to the hazards in the spacecraft environment such as total dose of electrons, protons, and cosmic rays. Typical silicon integrated circuit plastic packaged devices will fail to operate properly when exposed to total doses of 2 to 15 Krads. With the desire to have communication satellites work in orbit for periods of 8 to 15 years, this would rule out the use of almost all commercially available plastic packaged silicon integrated circuit devices.

A typical method of meeting the radiation requirements for space platform environments, known as spot shielding, involves direct application of the radiation shielding materials to the top and bottom of a ceramic integrated circuit device. Aside from the problem that this increases the thickness of the device and increases the weight of the device, it also has the disadvantage that the shield is a significant distance from the integrated circuit silicon die, permitting significant exposure to side angle radiation. Often a bottom spot shield cannot be used due to the offset in height which cannot be accommodated by a fixed device lead length causing problems when used in a printed circuit board "through-hole" package style. Also the shield has no mechanical support except the adhesive used to attach the shield to the surface of the plastic package.

Therefore, it would be highly desirable to be able to effectively shield a commercially available plastic packaged integrated circuit without substantially increasing the size and weight of the integrated circuit package.

Recognizing this problem, Sloan et al. in U.S. Pat. No. 4,468,411 disclosed a method to protect an integrated circuit die which has been prepared for packaging by depositing a liquid polyamide precursor compound on the active surface of the die. U.S. Pat. No. 4,468,411 is incorporated herein by reference. After the initial deposit is cured, additional deposits of the same material could be layered on top of it, thereby increasing the thickness of the protective material. In this way, a sufficiently thick polyamide coating provides alpha particle protection to the die, prior to the plastic encapsulation step.

This technique has several disadvantages. First, the alpha particle protection material must be deposited during the manufacturing process of the integrated circuit. Only after the silicon die has been layered with polyamide is the integrated circuit manufacturing process completed by plastic packaging. More importantly, space for accommodating the polyamide layers is very limited and it is therefore not possible to provide the thickness of protective material required to protect the silicon die from radiation encountered in space platforms.

Therefore, it would be highly desirable to be able to provide effective radiation shielding for commercially available plastic package integrated circuits to be used in various space application environments including low earth orbit, geostationary, or deep space probe.

U.S. Pat. No. 4,833,334 attempts to solve the problem of electronic circuit reliability in the aeronautical and space application environments by providing a protective box within which to house sensitive electronic components. U.S. Pat. No. 4,833,334 is incorporated herein by reference. This protective box is partially composed of a high atomic weight material to shield effectively against X-rays.

Although the protective box is effective in shielding its contents from harmful X-rays, this approach has the serious disadvantage of adding substantial bulk and weight to electronic circuit assemblies protected in this manner. Moreover, it would be expensive to provide this type of protection to individual integrated circuits as manufacturing custom boxes for each circuit configuration would undoubtedly be costly to manufacture. Therefore, the resulting protective boxes cause a significant weight gain, which is undesirable given the costs of placing devices into orbit.

Therefore, it would be highly desirable to have a new and improved method for enabling effective radiation shielding of commercially available package integrated circuits including plastic package integrated circuits, without significantly increasing the bulk or weight of the integrated circuits, in a cost effective and efficient manner.

Another significant problem impacting the protection of integrated circuits intended to be used in outer space is the variation in radiation environments found in different space orbits or trajectories. This significant variation in the amounts and energy levels of electrons, protons, solar particles and cosmic radiation make it very difficult to design a single radiation shielded package that would be universally adaptable to different outer space applications.

Therefore, it would be highly desirable to have a method of formulating radiation shield materials customized to provide radiation protection for integrated circuits, given the particular space application environment in which the integrated circuit is expected to function.

DISCLOSURE OF INVENTION

Therefore, the principal object of the present inventive method is to provide a new and improved process by which conventional plastic body packaged integrated circuits can be effectively radiation shielded without unduly increasing the size or weight of the integrated circuit.

Another object of the present invention is to provide a new and improved method of formulating radiation shield formulations which maximize the radiation shielding effects for a constant unit weight given the radiation characteristics of the space application environment the shielded integrated circuit is expected to function in.

Briefly, the above and further objects of the present inventive method are realized by providing a new and improved process by which plastic material forming the plastic body package of an integrated circuit is selectively removed and replaced with a radiation shield material having a specific formulation that is customized for a given radiation environment dependent upon the space application in which the integrated circuit is to be used.

The process begins with the modeling of the application environment based on orbit or trajectory information. This is used to calculate the total dose exposure which the device must survive over its projected useful life. This data is used to determine the radiation shielding characteristics of the shield member formulation to be utilized in a given space environment application. The typical plastic integrated circuit assembly includes the silicon integrated circuit die mounted on a leadframe with wirebonds connecting the circuit assembly (See FIG. 2). This assembly is encapsulated in plastics of various types to protect the die from the hazardous radiation of the atmosphere. The final packaged devices are tested for conformance to manufacturers specifications. Without the radiation shielding, these devices would not function properly for an extended period of time in the typical space application.

The present inventive method can be applied to most, if not all, commercially available plastic parts and result in at least a ten fold improvement in the devices ability to meet a given total dose rate. The result is a shielded integrated circuit that is structurally and thermally stable, and which retains the same thickness as the original plastic package.

An optional radiation shield design configuration can also be applied to any commercially available plastic part and results in at least a ten fold total dose improvement adding another physical dimension of radiation shielding through the side axes.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 3B is an enlarged plan view of a shielded integrated circuit exhibiting the critical dimensions required to be measured for the machining process step;

FIG. 4A is an enlarged cross-sectional view of a shielded integrated circuit showing a square notch shield configuration;

FIG. 4B is an enlarged cross-sectional view of a shielded integrated circuit showing a round notch configuration;

BEST MODE FOR CARRYING OUT THE INVENTION

Figure 1A:
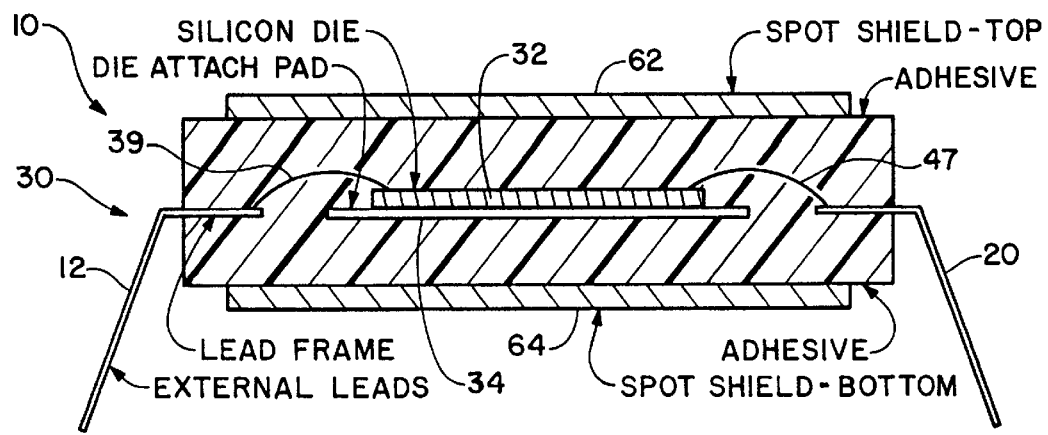
FIG. 1A is an enlarged cross-sectional view of a conventional integrated circuit and plastic configuration package which is spot shielded.
Figure 1B:
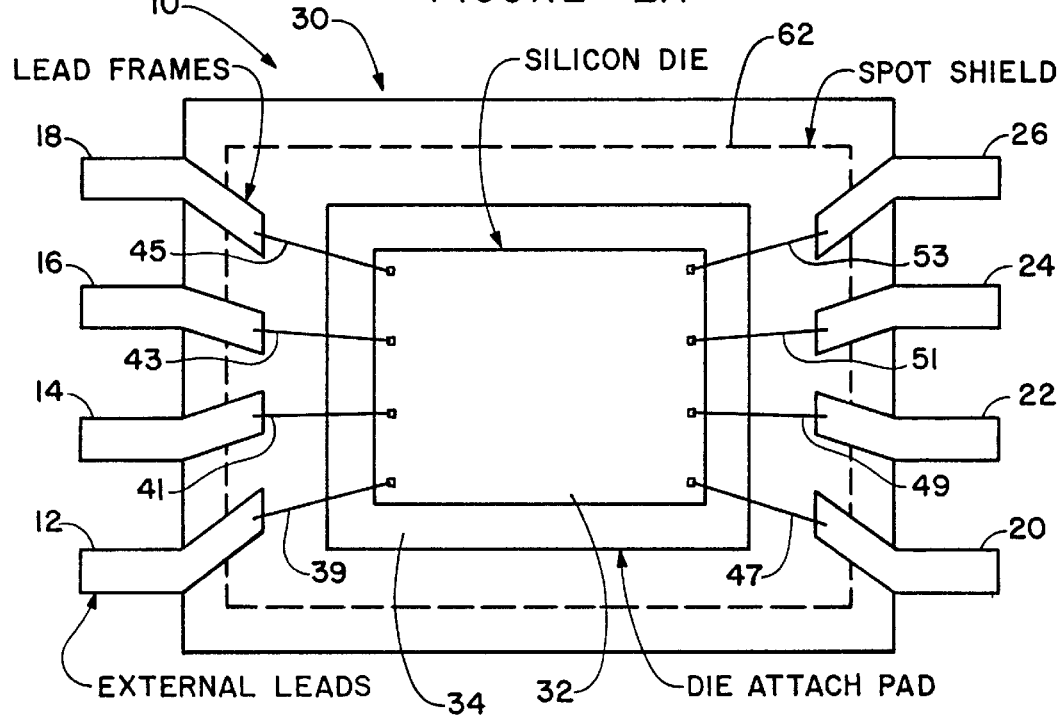
FIG. 1B is an enlarged plan view of a conventional integrated circuit in a plastic package configuration which is spot shielded.

Referring now to the drawings, and more particularly to FIGS. 1A and 1B thereof, there is shown an integrated circuit 10 that has been radiation shielded by the conventional spot shielding method. The integrated circuit 10 could be connected to a conventional circuit board via external leads 12, 14, 16, 18, 20, 22, 24 and 26.

The integrated circuit 10 includes a plastic body package 30 which houses the silicon die 32. The silicon die 32 lies on top of the die attach pad 34. Wirebonds 39, 41, 43, 45, 47, 49, 51 and 53 extend from the silicon die 32 to the lead frame ends positioned within the plastic body package 30. Two shielding members, a top shielding member 62 and a bottom shielding member 64 are affixed to the upper and lower surface of plastic body package 30.

The radiation shielded integrated circuit 10, illustrated in FIGS. 1A and 1B has been created using the conventional method of spot shielding. Shielding members 62 and 64, generally composed of heavy metal compounds are spot welded into position on the upper and lower surface of the plastic body package 30. As a result, the integrated circuit 10 is made larger and heavier. The silicon die 32 is protected from radiation impinging the die 32 from directly above and directly below the die 32. However, the spot shielding method of protecting the die 32 leaves it vulnerable to radiation impinging upon the die 32 from the sides, where no protective shielding is placed. Therefore, the conventional spot shielding technique has the disadvantage of increasing the bulk and weight of the integrated circuit, while leaving the silicon die vulnerable to radiation entering the plastic body package from the sides.

Figure 2A:
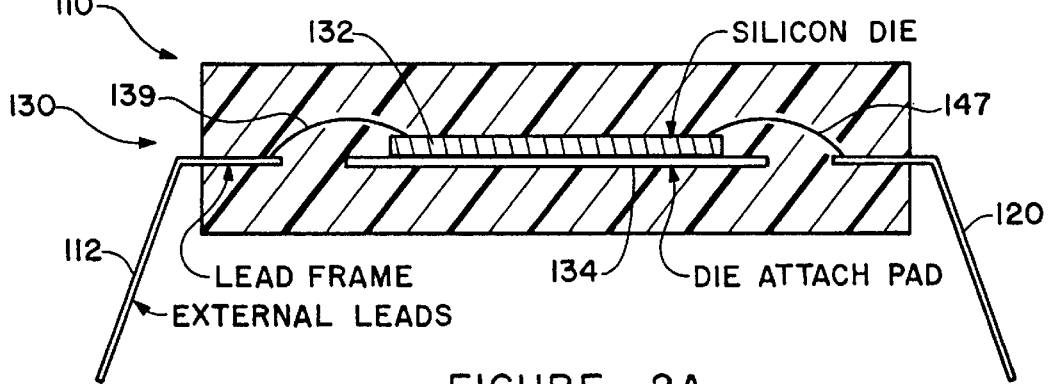
FIG. 2A is an enlarged cross-sectional view of a conventional integrated circuit and plastic package configuration.
Figure 2B:
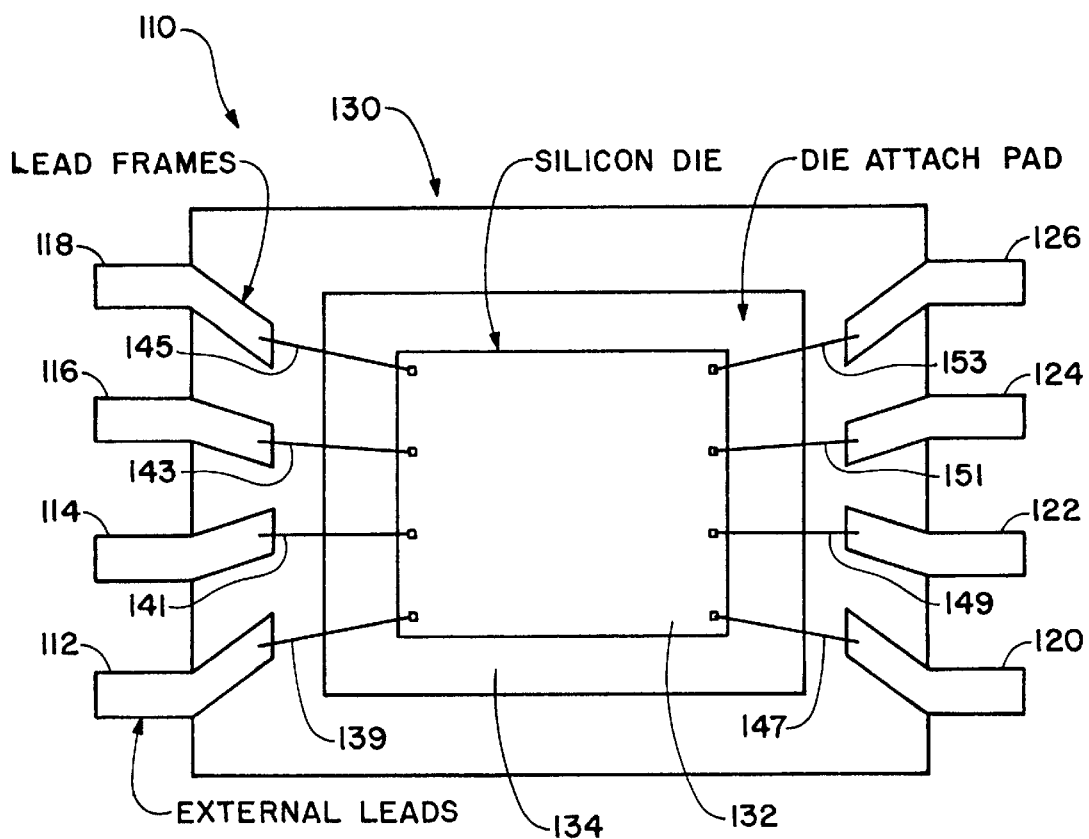
FIG. 2B is an enlarged plan view of a conventional integrated circuit and plastic package configuration.

Referring now to FIGS. 2A and 2B, there is shown a conventional integrated circuit 110 which will be radiation shielded using the present inventive method.

The conventional integrated circuit 110 includes a plastic body package 130 which houses the silicon die 132. The silicon die 132 lies on top of the die attach pad 134. Lead frames 112, 114, 116, 118, 120, 122, 124 and 126 are partially embedded within the plastic body package 130, and extend outward from the plastic body 130 to provide electrical communication between the integrated circuit and external electrical connections. Wirebonds 139, 141, 143, 145, 147, 149, 151 and 153 extend from the silicon die 132 to the lead frame ends positioned within the plastic body package 130.

The present inventive process involves the initial step of determining the dimensional relationships between the components of an integrated circuit to be radiation shielded. Using radiography, the commercial plastic component is X-rayed in all profiles to obtain precise measurements of the distances indicated in FIGS. 3A and 3B as x1, h1, w1, x2, w2, h2 and h3.

x1 represents the horizontal distance from one edge of the plastic body to the closest corresponding parallel edge of the silicon die. h1 represents the vertical distance from the top of the highest wirebond to the upper surface of the plastic body. w1 represents the horizontal width of the silicon die. x2 represents the horizontal distance between another edge of the plastic body to the closest corresponding parallel edge of the silicon die. h2 represents the vertical distance from the upper surface of the silicon die and the upper surface of the plastic body. And h3 represents the vertical distance from the bottom surface of the lowest lead frame and the bottom surface of the plastic body.

The x-ray observations are performed under magnification so the precise measurements can be made. This dimensional information is used in the subsequent machine steps and to generate the complementary shaped shield members.

The next step in the present inventive process of radiation shielding of plastic integrated circuits involves machining operations to selectively remove certain portions of the plastic body while avoiding contacting the internal elements of the integrated circuit. In this regard, a nonobtrusive cutting away of these plastic portions is accomplished using the dimensional relationships obtained in the previous step of the novel process.

Figure 3A:
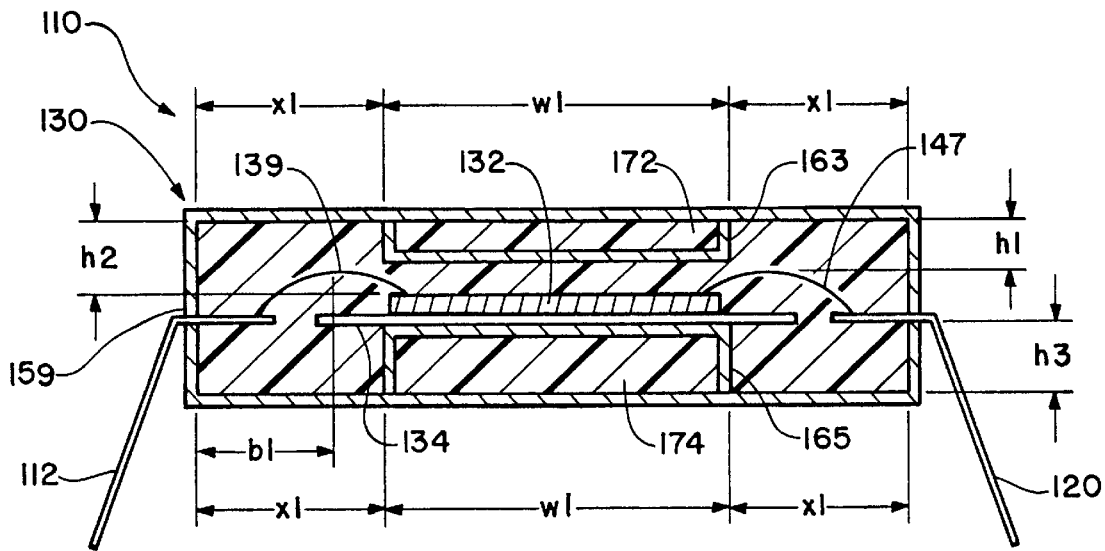
FIG. 3A is an enlarged cross-sectional view of shielded integrated circuit exhibiting the critical dimensions required to be measured for the machining process step.

Typically, vertical machining is performed as close as 15 to 20 mils from the highest wirebond, dimension h1, into the top surface of the plastic body, and as close as 5 mils from the lead frame, dimension h3, into the bottom surface of the plastic body, as best shown in FIG. 3A.

Horizontal machining is performed by using dimensions x1 and x2 to center the machining tool and selectively cutting away that portion of plastic located within the w1 and w2 dimensions.

Dimensions x1 and x2 are required to determine the placement of the machining relative to the side of the package. This is considered to be a non-obtrusive penetration of the device. The shape of the milling tool used would depend on the PLAS-PAK™ shield to be used.

An alternative to the machining operation described in 2 above, is another shield design which improves the overall shielding area (yielding added side-axes protection) as well as the thermal and structural stability as shown in FIG. 4. As in paragraph 2 above, the machining operation involves removal of the material associated with h1, FIG. 3, but also requires routing a notch on each side of the device as shown in FIGS. 4A and 4B. The choice between square or round notches will depend on the characteristics of the shielding material and fabrication costs.

The next step is to apply a custom radiation shielding material based on a formulation of high-Z material (such as copper tungsten alloy or tantalum, or similar shielding material) in both the base and top surfaces of the existing package. These radiation shields will be designed to meet the requirements for a given mission. This in effect sandwiches the silicon die as close as is practical between protective shielding layers. These shield are epoxied into place, using semiconductor liquid/plastic encapsulant (such as Hysol FP4323) to encapsulate the shield into the milled-out areas (See FIG. 5).

The entire device is encapsulated in epoxy to improve physical shield integrity and moisture resistance, then marked as per commercial standards. If additional improvements in thermal conductivity is required, the outer surface of the shield will not be encapsulated.

This process would be applied to devices procured on a lot basis so the Class S screening and traceability requirements could be met. Other lot certification tests such as 100% thermal cycling, environmental qualification, and reliability testing is then conducted. Also, sample or Lot x-ray images could be done to insure the non-obtrusive nature of the machining.

The shield members are custom created, and they are affixed to the complementary shaped cut away portions of the plastic body using epoxy layers 163 and 165. The shield members are epoxied into place using a semiconductor liquid plastic encapsulant, such as Hysol FP 4323 available from commercial suppliers of liquid plastic encapsulants.

Finally, the entire shielded integrated circuit is encapsulated in epoxy 159 to improve shield integrity and moisture resistance, then marked as per commercial standards. If additional improvement in thermal conductivity is required, the outer surface of the shielded integrated circuit will not be encapsulated.

Referring now to FIG. 4A, there is shown another radiation shielded integrated circuit 210, which is constructed in accordance with the present inventive method, and which is similar to the shielded integrated circuit 110, except that the shielded integrated circuit 210 has stepped shield members which are held in place using a notch configuration.

The integrated circuit 210 includes component parts such as lead frames 212 and 220, wirebonds 239 and 247, a plastic body package 230, silicon die 232 and a die attach pad 234, all as previously described for FIGS. 3A and 3B. The difference in this embodiment of the present invention lies in the shield member configuration. The process of generating the shield member is similar to that previously described for FIGS. 3A and 3B except the shield members 272 and 274 are of a stepped configuration. Additional material is selectively cut away from the plastic body 230 to accommodate the upper stepped shield member 272 and the lower stepped shield member 274.

Upper stepped shield member 272 is essentially a rectangular block similar to the upper shield member shown in FIG. 3A including integral laterally extended flange portions 282 and 284 forming a T-shaped shield member. Beyond the laterally extended flange portions 282 and 284 are pairs of left and right L-shaped end flanges 292 and 294. These end flanges 292 and 294 have an integral square shaped protrusions 293 and 295, respectively, which fit snugly into complementary shaped recesses 281 and 283, respectively, routed out of the plastic body 230 during the machining process. This notch and recess configuration allows the upper stepped shield member 272 to be snapped on or slid into place on the machined plastic body 230 to be held in position above the silicon die 232, to shield it from impinging radiation.

The lower stepped shield member 274 is constructed in a similar manner as previously described for the upper stepped shield member 272. There are no equivalents to the laterally extended flange portions 282 and 284 of the upper stepped shield member 272. Instead, the rectangular block portion 275 of the lower stepped shield member 274 has a pair of integral L-shaped end flanges 286 and 288. The rectangular block portion 275 is larger, extending at least the width of the die attach pad 234, and more commonly extending to beneath the lead frames 212 and 220. As with the upper stepped shield member 272, the lower stepped shield member 274 has end flanges 286 and 288 which include integral square shaped protrusions 285 and 287, respectively, which fit snugly into complementary shaped recesses 289 and 290, respectively, routed out of the plastic body 230 during the machine process. Likewise, this notch and recess configuration allows the lower shield member 274 to be snapped on or slid into place on the machined plastic body 230 to be held in position below the silicon die 232, to shield it from impinging radiation.

Referring now to FIG. 4B, there is shown another radiation shielded integrated circuit 310, which is constructed in accordance with the present inventive method, and which is similar to the shielded integrated circuit 210, except that the protrusion and recess arrangement on each end flange 386, 388, 392 and 394 of the stepped radiation shield members 372 and 374, has a round configuration. That is, protrusions 385, 387, 393 and 395, which are integral to the L-shaped end flanges 386, 388, 389, and 394, respectively, have a round configuration meant to fit snugly into the complementary shaped recesses 381, 383, 385 and 389, that have been routed out of the plastic body 330 of the integrated circuit 310 during the machine process. In this way, the stepped radiation shield members 372 and 374 can be snapped on or slid into place on the remaining portion of the plastic body 330 of the integrated circuit 310, to protect the silicon die 332 from the harmful effects of radiation.

The radiation shield members used in the notch configurations described for FIGS. 4A and 4B are stepped to within 5 mils of the top surface of the silicon die and 5 mils of the bottom surface of the die attach pad. This increases the thickness of the radiation shield member which increases the overall radiation protection for the silicon die. Additionally, the notch configured radiation shield members improve the overall shielding area by the added side axes protection provided by the L-shaped end flanges on both the top and bottom shield member. Thermal and structural stability are enhanced as well. The choice between square notch and round notch configurations will depend upon the characteristics of the shielding material and fabrication costs.

Figure 5A:
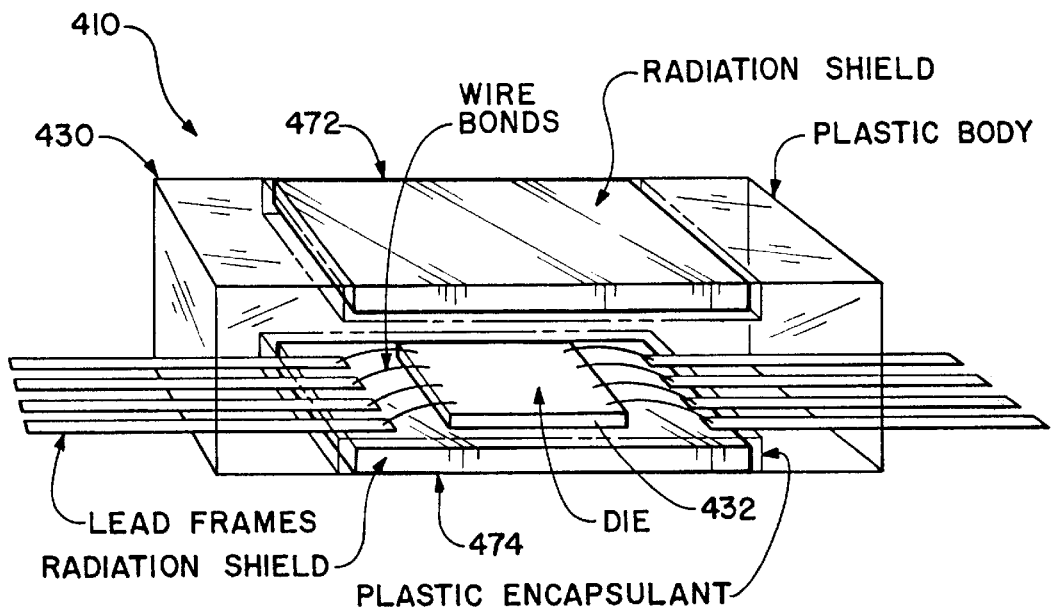
FIG. 5A is a typical commercial integrated circuit in a plastic configuration with radiation shields integrated into the package.

Referring now to FIG. 5A, there is shown another radiation shielded integrated circuit 410, which is constructed in accordance with the present inventive method, and which is similar to the radiation shielded integrated circuit 110 as shown in FIG. 3A, except that the upper radiation shield member 472 and the lower radiation shield member 474 are larger and cover more area to provide greater protection for the silicon die 432. A greater portion of the plastic body 430 of integrated circuit 410 has been selectively removed in order to accommodate the larger shield members.

Figure 5B:
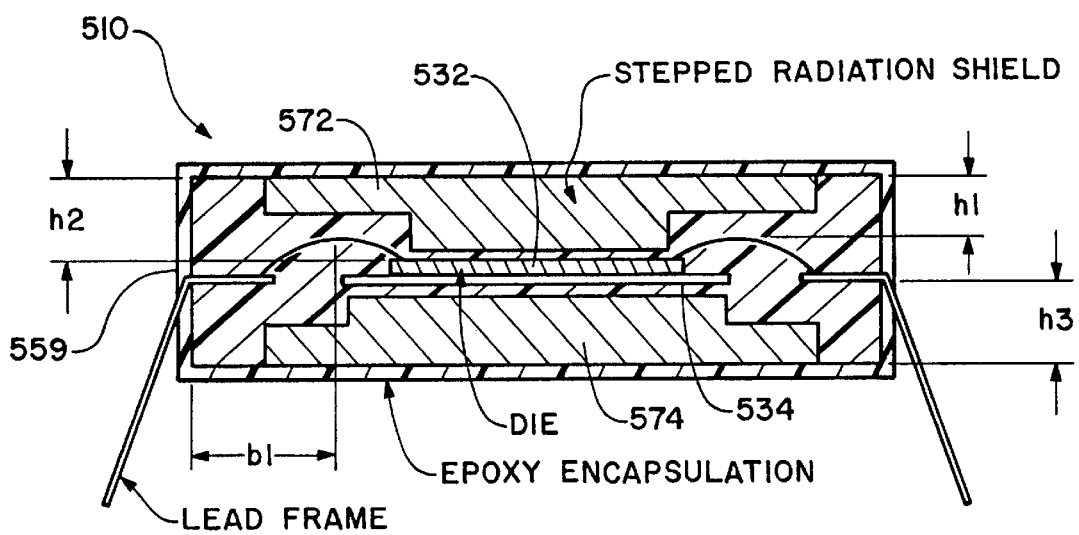
FIG. 5B is an enlarged cross-sectional view of a shielded integrated circuit exhibiting a stepped radiation shield configuration.

Referring now to FIG. 5B, there is shown another radiation shielded integrated circuit 510, which is constructed in accordance with the present inventive method, and which is similar to the radiation shielded integrated circuit 410 as shown in FIG. 5A, except that the upper and lower radiation shield members 572 and 574 are stepped to come within 5 mils of the top surface of the silicon die 532, dimension h2, within the w1 and w2 area, and to within 5 mils of the bottom surface of the die attach pad 534, dimension h3. Finally, the shielded integrated circuit is completely encapsulated with encapsulant 559.

Custom Shield Material Formulations

The following procedure is employed for determining the optimal or at least preferred composition of shield material, to maximize or at least improve greatly the shielding effectiveness for a constant unit weight. The most effective composition is dependent upon the space application, specifically the orbit (eg. low earth orbit, geostationary orbit or eccentric orbit). This dependency is due to the relative mix of trapped electrons, trapped protons, solar particles and cosmic rays in various trapped belts (eg. Van Allen belts) or in various altitudes and inclinations, which provide differing levels of geomagnetic shielding. The total ionizing dose incident upon a spacecraft, and ultimately upon a sensitive integrated circuit, is comprised of the contributions from all such naturally occurring particles.

The optimal or preferred formulation/composition for a specific radiation shield can be expressed as:

$$F_{OPT} = X_{LZ} + Y_{HZ} \tag{1}$$

where, $X_{LZ}$=percentage, by weight, of low atomic number (Z) material (low Z is defined as material with Z<50; such as copper or aluminum);

$Y_{HZ}$ percentage, by weight, of high Z material (high Z is defined as material with Z>50; such as tantalum, tungsten or lead).

In general, the composition formulations are preferably determined with the aid of a conventional computer (not shown). According to the procedure, several assumptions are made. To illustrate the process, a simplified example will now be explained one set of assumptions or approximations relates to the radiation environment. Firstly, there are various naturally occurring types of radiation particles, including electrons, protons, solar particles, cosmic rays and the like.

Secondly, the radiation environment includes various different energy levels, usually measured in millions of electron volts (MeV). For purposes of the inventive determination, the various energy levels are categorized in discrete groups or bins by the quantity of the energy level. In this regard, the first bin is defined to be all radiation emanating from particles between 0 and 1 MeV. The second bin is defined to be all radiation emanating from particles between 1 and 2 MeV. The remaining bins are similarly defined in increasing steps of 1 MeV each.

Assume only one bin of the radiation environment is present in the present simplified example, that is that the only radiation that exists has a level between 0 and 1 MeV. Other assumptions, for the purposes of this illustration only, are that only electrons and protons make up the radiation environment, and that all linear relationships exist.

To begin, in accordance with the inventive procedure, the stopping power of various high and low Z substances with respect to the expected energy level of radiation for a given space environment are considered. For the purposes of this illustration, only tungsten (high Z) and aluminum (low Z) will be considered. The radiation produced by the energy levels is expressed in rads (Si) relative to silicon, that is, the amount of radiation in rads absorbed by silicon. The stopping power of the materials is defined to be equal to the amount of radiation incident on the material minus the amount of radiation absorbed or shielded. This stopping power would be calculated for each type of radiation for electrons and protons, and with respect to each high Z and low Z substances selected to be tested.

In the present invention, considering electrons firstly, assume that they produce at this bin energy level, 100 rad (Si) of radiation, which when incident upon tungsten, caused 90 rad (Si) to be absorbed, and 10 rad (Si) to pass therethrough. In this regard, 100−90=10. Thus, the stopping power is equal to 10 rad (Si), which is equal to the radiation passing through the tungsten shield material.

Similarly, when the 100 rad (Si) is incident upon aluminum, 20 rad (Si) passes therethrough to provide a stopping power of 20 rad (Si). Thus, at this bin energy level, tungsten is preferred, because the stopping power (radiation out) is preferred, since tungsten is preferred for blocking electrons.

Next, the proton radiation is considered. Assuming 100 rad (Si) is incident on tungsten, 30 rad (Si) passes therefrom to determine the stopping power. Also, assuming 100 rad (Si) is incident onto aluminum, 50 rad (Si) stopping power results. As a result, aluminum has a preferred stopping power for protons at this energy level.

The next step is to add the stopping powers for tungsten by adding 10 and 50 to give a total of 60 rad (Si). The total stopping power for aluminum is then determined by adding 20 plus 30 to provide a total of 50 rad (Si).

Thus, it may be seen that 100% aluminum is preferred as being overall more effective for both electrons and protons. Also, a combination of both tungsten and aluminum would overall be less effective. For example, 50% tungsten and 50% aluminum would provide an effective or combined stopping power of 55 rad (Si), which is half way between the stopping powers of tungsten and aluminum. As a result, since 100% aluminum exhibits a stopping power of 50 rad (Si), 100% aluminum is preferred over a mixture of aluminum and tungsten.

This procedure can be extended to other shield materials and over particle radiation. The procedure is then performed for other bins of energy levels. A summation of all stopping powers of all bins is then determined to arrive at the preferred percentages of high Z and low Z materials for the final shield composition.

High Z materials are known to be more effective at stopping electrons and low Z materials are known to be more effective at stopping protons. The final composition exhibits the preferred stopping power relative to all forms and sources of radiation with the least unit weight or density. The final high Z and low Z percentages are based by weight.

The generalized procedure for determining the percentages of low Z and high Z material for a specific application will now be considered.

1. Determine a breakdown (bin) of the radiation environment, by radiation type and energy level, and express the total radiation environment as:

$$\Sigma_{ENV} = \begin{array}{l} a_1e_1 + a_2e_2 + \ldots + a_ie_i + b_1p_1 + b_2p_2 + \ldots + b_ip_i + c_1t_1 + \\ c_2t_2 + \ldots + c_it_i + d_1r_1 + d_2r_2 + \ldots + d_ir_i \end{array} \quad (2)$$

where, $a_1$=amount of radiation between energy levels 0 to 1 MeV ($a_2$: between 1 and 2 MeV, $a_i$: between i−1 and i MeV);

$e_1$=radiation type, electrons;

$b_1$=amount of radiation between energy levels 0 to 1 MeV ($b_2$: between 1 and 2 MeV, $b_i$: between i−1 and i MeV);

$p_1$=radiation type, protons;

$c_1$=amount of radiation between energy levels 0 to 1 MeV ($c_2$: between 1 and 2 MeV, $c_i$: between i−1 and i MeV);

$t_1$=radiation type, solar particles;

$d_1$=amount of radiation between energy levels 0 to 1 MeV ($d_2$: between 1 and 2 MeV, $d_i$: between i−1 and i MeV); and $r_1$=radiation type, cosmic rays.

$a_1$, $b_1$, $c_1$ and $d_1$ are constants for a given space environment and are found in space radiation models such as NASA's AP8 or AE8 space radiation models, used for determining the amount of radiation in a specific orbit. This space radiation model gives complete data for trapped electrons, trapped protons, solar flares and cosmic rays for a given space radiation application environment.

2. For each specific bin of radiation type and energy level (for example $a_ie_i$), determine the stopping power for each high Z and low Z shielding material. The value of the stopping power is determined by the below equation by radiation transport calculations, through the desired materials, holding the weight of the material constant. Individual stopping power can be expressed as:

$$SP_{Qm}=\text{(radiation in)}-\text{(radiation shielded)} \quad (3)$$

where, q=radiation type and energy bin (example: $a_1e_1$); and m=material type, high and/or low Z.

3. Calculate the total weighted amount of radiation allowed through each material by material type and radiation type, using the following equations:

$$\Sigma SP(e_i,X)=a_1*SP_{e1X}+a_2*SP_{e2X}+\ldots+a_i*SP_{eiX} \quad (4)$$

$$\Sigma SP(e_i,Y)=a_1*SP_{e1Y}+a_2*SP_{e2Y}+\ldots+a_i*SP_{eiY} \quad (5)$$

where,

X=low Z material, transported as m above.

Y=high Z material, transported as m above.

Repeat for all radiation types.

4. Adjust the percentages of materials X and Y which minimizes or at least greatly reduces the weighted sum of each energy bin stopping power, using the following expression:

$$\Sigma_{TOT} \Sigma SP(e_i,X)+\Sigma SP(e_i,Y)+\Sigma SP(P_i,X)+\Sigma SP(p_i,Y)+\Sigma SP(t_i,X)+ \\ \Sigma SP(t_i,Y)+\Sigma SP(r_i,X)+\Sigma SP(r_i,Y).$$

Preferred shield material formulations include high atomic number substances include tungsten, tantalum and lead, and low atomic number substances include copper, aluminum and silicon. Examples of formulations for radiation protection of integrated circuits in space platforms generally contain between about 80% by weight and about 90% by weight high atomic number material and between about 10% by weight and about 20% by weight low atomic number material. The following are examples of preferred shield compositions:

EXAMPLE 1

Tungsten 90% by weight

Copper 10% by weight

EXAMPLE 2

Tungsten 80% by weight

Copper 20% by weight

EXAMPLE 3

Tungsten 85% by weight

Copper 15% by weight

To fabricate the shield members, sheets of the high and low Z materials can be laminated together in the proper proportions. Alternatively, the shield members may be fabricated by admixing the preferred proportions of powdered high Z and low Z substances together. The high Z and low Z substances are then compressed and stamped. The heat generated by this process leads to heat binding of the radiation shield member components.

Any high Z material may be used with any low Z material, and one or more, including three or more such materials can be combined. Three or even four different substances, or more, may be combined to satisfy the preferred composition for the shield member.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A method of making a shielded integrated circuit, comprising:

using a plastic integrated circuit having a plastic body with internal elements;

visualizing the location of the internal elements;

cutting away selectively certain portions of the plastic body while avoiding contacting the internal elements to create a plurality of cutout portions;

providing complementary shaped shielding members dimensioned suitably to fit within said cutout portions; and affixing the complementary shaped shielding members within said cutout portions to shield the integrated circuit from radiation.

2. The method of claim 1, wherein visualizing the internal elements includes using radiographic techniques.

3. The method of claim 2, wherein visualizing the internal elements using radiographic techniques including x-raying the integrated circuit in all profiles.

4. The method of claim 3, wherein the integrated circuit is x-rayed under magnification.

5. The method of claim 1, wherein providing shielding members includes:

modeling the integrated circuit application environment based upon orbit or trajectory data to calculate the total dose exposure that the integrated circuit must survive over its useful life;

formulating a radiation shielding material with radiation shielding characteristics sufficient to protect the integrated circuit in its proposed application environment; and fabricating a custom radiation shield component composed of the radiation shield material formulated to protect the integrated circuit in the application environment.

6. A shielded integrated circuit made by the process of claim 1, wherein complementary shield members are affixed within complementary shaped cut away portions of the plastic body of the integrated circuit to shield the integrated circuit from radiation.

7. The method of claim 1, wherein the shielding member is composed of on a formulation of high Z material.

8. The method of claim 7, wherein said high Z material includes copper-tungsten alloy or tantalum.

9. The method of claim 1, wherein the cutting away selectively of certain portions of the integrated circuit plastic body package is performed to within 15 to 20 mils of the highest wirebond on the top side and to within 5 mils of the leadframe on the bottom side.

10. The method of claim 9, wherein the cutting away selectively of certain portions of the integrated circuit plastic body package is stepped to within 5 mils of the top of the die on the top side.

11. The method of claim 1, wherein affixing said shielding members to the cut-away portions of the plastic body package of the integrated circuit includes epoxying the shield component into place using a semiconductor liquid/plastic encapsulant.

12. The method of claim 11, wherein said semiconductor liquid/plastic encapsulant includes Hysol FP4323.

13. The method of claim 1, wherein:

cutting away selectively of certain portions of the integrated circuit plastic body package includes cutting away a notch along the entire length of two parallel sides on the top side and bottom side of the body package;

providing a shielding member for the top side and the bottom side of the integrated circuit fabricated to fit snugly within the space created by the cutting away step performed, both having a protruding portion on the inner surface of the outer wall of two parallel sides, that is the inverse of the notch cut away from the integrated circuit plastic body package; and applying fixedly mechanically said shielding members to the cut away and notched portions of the integrated circuit plastic body package.

14. The method of claim 13, wherein said cut away notch is rectangular in shape.

15. The method of claim 13, wherein said cut away notch is round in shape.

16. The method of claim 5, wherein modeling the integrated circuit application environment based upon orbit or trajectory data to calculate the total dose exposure that the integrated circuit must survive over its useful life is done using a computer.

17. The method of claim 16, further including utilizing input data on the expected orbit or trajectory application environment for an integrated circuit to formulate a custom radiation shield material effective in protecting the integrated circuit from radiation in the proposed application environment.

18. A method according to claim 5, wherein said formulating of said radiation shielding material includes:

$$F_{OPT} = X_{LZ} + Y_{HZ}$$

where, $F_{OPT}$=the optimal composition for a specific radiation shield;

$X_{LZ}$=the percentage, by weight, of low atomic number (Z) material; and $Y_{HZ}$=the percentage, by weight, of high atomic number (Z) material;

determining a breakdown of the radiation environment, by radiation type and energy level and expressing the total radiation environment as:

$$\Sigma_{ENV} = \begin{array}{l} a_1e_1 + a_2e_2 + \ldots + a_ie_i + b_1p_1 + b_2p_2 + \ldots + b_ip_i + c_1t_1 + \\ c_2t_2 + \ldots + c_it_i + d_1r_1 + d_2r_2 + \ldots + d_ir_i \end{array}$$

where, $a_1$=amount of radiation between energy levels 0 to 1 MeV ($a_2$: between 1 and 2 MeV, $a_i$: between i−1 and i MeV);

$e_1$=radiation type, electrons;

$b_1$=amount of radiation between energy levels 0 to 1 MeV ($b_2$: between 1 and 2 MeV, $b_i$: between i−1 and i MeV);

$p_1$=radiation type, protons;

$c_1$=amount of radiation between energy levels 0 to 1 MeV ($c_2$: between 1 and 2 MeV, $c_i$: between i−1 and i MeV);

$t_1$=*radiation type, solar particles;*

$d_1$=amount of radiation between energy levels 0 to 1 MeV ($d_2$: between 1 and 2 MeV, $d_i$: between i−1 and i MeV); and $t_1$=radiation type, cosmic rays;

determining the stopping power for each high atomic weight substance and low atomic weight substance to be used for radiation shielding, using:

$$SP_{qm} = \text{(radiation in)} - \text{(radiation shielded)}$$

where, q=radiation type and energy bin (example: $a_1 e_1$)

m=material type, high and/or low Z;

calculating the total weighted amount of radiation allowed through each substance by substance type and radiation type, using:

$$\Sigma SP(e_i, X) = a_1 * SP_{e1X} + a_2 * SP_{e2X} + \ldots + a_i * SP_{eiX}$$

$$\Sigma SP(e_i, Y) = a_1 * SP_{e1Y} + a_2 * SP_{e2Y} + \ldots + a_i * SP_{eiY}$$

where,

X=low Z material, transported as m above;

Y=high Z material, transported as m above;

adjusting the percentages of high atomic weight substance and low atomic weight substance to minimize the weighted sum of each energy level stopping power, using:

$$\Sigma_{TOT} = \Sigma SP(e_i, X) + \Sigma SP(e_i, Y) + \Sigma SP(P_i, X) + \Sigma SP(p_i, Y) + \Sigma SP(t_i, X) + \Sigma SP(t_i, Y) + \Sigma SP(r_i, X) + \Sigma SP(r_i, Y).$$

19. A method according to claim 18, wherein said low atomic number material is a material selected from the group consisting of copper, aluminum and silicon.

20. A method according to claim 18, wherein said high atomic number material is a material selected from the group consisting of tungsten, tantalum and lead.

21. A formulation for a shield material to protect an integrated circuit device having a plastic body with internal elements from damage caused by natural radiation in outer space, consisting essentially of:

a high atomic weight substance for radiation shielding selected from the group consisting of tungsten, tantalum and lead;

a low atomic weight substance for radiation shielding to act as an extender to decrease the overall density of the shield material and selected from the group consisting of copper, aluminum and silicon; and wherein the shield material includes an overall mixture of about 90% high atomic weight substance and about 10% low atomic weight substance.

22. A formulation for a shield material according to claim 21, wherein the shield material includes about 85% high atomic weight substance and about 15% low atomic weight substance.

23. A formulation for a shield material according to claim 21, wherein the shield material includes about 80% high atomic weight substance and about 20% low atomic weight substance.

24. A method of making a radiation shield composition for an integrated circuit device having a plastic body with internal elements to protect against damage caused by natural radiation in outer space, the method comprising:

visualizing the location of the internal elements;

cutting away selectively certain portions of the plastic body while avoiding contacting the internal elements to create a plurality of cutout portions;

providing complementary shaped shielding members dimensioned suitably to fit within said cutout portions;

affixing the complementary shaped shielding members within said cutout portions to shield the integrated circuit from radiation;

modeling the integrated circuit application environment based upon orbit or trajectory data to calculate the total dose exposure that the integrated circuit must survive over its useful life;

formulating a radiation shielding material with radiation shielding characteristics sufficient to protect the integrated circuit in its proposed application environment;

fabricating a custom radiation shield component composed of the radiation shield material formulated to protect the integrated circuit in the application environment;

said step of formulating a radiation shielding material including:

determining the stopping power for a group of high Z materials for a first bin for a first radiation producing particle;

determining the stopping power for a group of low Z materials for said first bin for said first radiation producing particle;

determining the stopping power for a group of high Z materials for a first bin for a second radiation producing particle;

determining the stopping power for a group of low Z materials for said first bin for said second radiation producing particle;

determining the stopping power for a group of high Z materials for a first bin for a third radiation producing particle;

determining the stopping power for a group of low Z materials for said first bin for said third radiation producing particle;

determining the stopping power for a group of high Z materials for a first bin for a fourth radiation producing particle;

determining the stopping power for a group of low Z materials for said first bin for said fourth radiation producing particle;

determining the stopping power for a group of high Z materials for a second bin for a first radiation producing particle;

determining the stopping power for a group of low Z materials for said second bin for said first radiation producing particle;

determining the stopping power for a group of high Z materials for a second bin for a second radiation producing particle;

determining the stopping power for a group of low Z materials for said second bin for said second radiation producing particle;

determining the stopping power for a group of high Z materials for a second bin for a third radiation producing particle;

determining the stopping power for a group of low Z materials for said second bin for said third radiation producing particle;

determining the stopping power for a group of high Z materials for a second bin for a fourth radiation producing particle;

determining the stopping power for a group of low Z materials for said second bin for said fourth radiation producing particle;

determining the stopping power for a group of high Z materials for an nth bin for a first radiation producing particle;

determining the stopping power for a group of low Z materials for said nth bin for said first radiation producing particle;

determining the stopping power for a group of high Z materials for an nth bin for a second radiation producing particle;

determining the stopping power for a group of low Z materials for said nth bin for said second radiation producing particle;

determining the stopping power for a group of high Z materials for an nth bin for a third radiation producing particle;

determining the stopping power for a group of low Z materials for said nth bin for said third radiation producing particle;

determining the stopping power for a group of high Z materials for an nth bin for a fourth radiation producing particle;

determining the stopping power for a group of low Z materials for said nth bin for said fourth radiation producing particle;

summing all of said determined stopping powers for all of said bins to ascertain the percentage by weight of each material to be admixed in the shield composition, said steps of determining and summing being accomplished according to the following formula:

each one of said steps of determining being accomplished by using:

$$SP_{qm} = (\text{radiation in}) - (\text{radiation shielded})$$

where, q=radiation type and energy bin
m=material type, high and/or low Z;

wherein said step of summing to ascertain the percentage by weight of each material to be admixed in the shield composition is performed by:

initially calculating the total weighted amount of radiation permitted through each material based on material type and radiation type for an initial combination of high atomic material and low atomic material, using:

$$\Sigma SP(e_i, X) = a_1 * SP_{e1X} + a_2 * SP_{e2X} + \ldots + a_i * SP_{eiX}$$

$$\Sigma SP(e_i, Y) = a_1 * SP_{e1Y} + a_2 * SP_{e2Y} + \ldots + a_i * SP_{eiY}$$

where,

X=low Z material, transported as m above;
Y=high Z material, transported as m above; and subsequently calculating total summations, using:

$$\Sigma_{TOT} = \Sigma SP(e_i, X) + \Sigma SP(e_i, Y) + \Sigma SP(P_i, X) + \Sigma SP(p_i, Y) + \Sigma SP(t_i, X) + \Sigma SP(t_i, Y) + \Sigma SP(r_i, X) + \Sigma SP(r_i, Y).$$

repeating said step of formulating for other combinations of said high atomic weight material and said low atomic weight material to determine total summations therefor;

said step of fabricating said custom radiation shield component including finally determining the preferred radiation shield material as including preferred percentages of high atomic weight substances and low atomic weight substances to reduce greatly the weighted sum of each energy level stopping power by determining the smallest one of said total summations.

* * * * *